US007646594B2

(12) United States Patent
Huang et al.

(10) Patent No.: US 7,646,594 B2
(45) Date of Patent: Jan. 12, 2010

(54) BLADE SERVER SYSTEM

(75) Inventors: Jen-Hsuen Huang, Pate (TW); Ling-An Chao, Taoyuan (TW)

(73) Assignee: Quanta Computer Inc., Tao Yuan Shien (TW)

( * ) Notice: Subject to any disclaimer, the term of this patent is extended or adjusted under 35 U.S.C. 154(b) by 902 days.

(21) Appl. No.: 11/072,261

(22) Filed: Mar. 7, 2005

(65) Prior Publication Data

US 2006/0003638 A1 Jan. 5, 2006

(30) Foreign Application Priority Data

Jun. 30, 2004 (TW) .............................. 93210336 U

(51) Int. Cl.
*H05K 5/00* (2006.01)

(52) U.S. Cl. ................................................. 361/679.31

(58) Field of Classification Search .................. 439/71, 439/67; 361/679.31
See application file for complete search history.

(56) References Cited

U.S. PATENT DOCUMENTS

| | | | | |
|---|---|---|---|---|
| 3,432,796 | A * | 3/1969 | Reimer ........................ | 439/85 |
| 6,969,266 | B2 * | 11/2005 | Chu et al. ..................... | 439/70 |
| 2004/0264146 | A1 * | 12/2004 | Kerrigan et al. ............. | 361/726 |

* cited by examiner

*Primary Examiner*—Neil Abrams
*Assistant Examiner*—Phuong Nguyen
(74) *Attorney, Agent, or Firm*—Rabin & Berdo, PC

(57) ABSTRACT

A server blade system including a middle plane board and a server blade is provided. The server blade includes a first connector for electrically connecting the middle plane board. The first connector has several pins complying with a specific connector specification. A specific first pin and a specific second pin of the pins are for USB application.

5 Claims, 3 Drawing Sheets

BLADE SERVER SYSTEM

This application claims the benefit of Taiwan application Serial No. 93210336, filed Jun. 30, 2004, the subject matter of which is incorporated herein by reference.

BACKGROUND OF THE INVENTION

1. Field of the Invention

The invention relates in general to a blade server system, and more particularly to a blade server system which designates and locks two specific pins of a connector on a server blade for a universal serial bus (USB) special application.

2. Description of the Related Art

Ordinary data/resource sharing is built on the operating systems at two terminals (Windows for example), which are linked via a network, and cannot be achieved if the operating system does not provide active network support (a DOS for example) or before the operating system is loaded. Current blade server system, which receives several server blades at the same time, and thus saves a large amount of storage space. Due to the lack of an optical disc drive or a floppy disc drive inside a blade server, operating difficulties would occur for a server without an operating system.

SUMMARY OF THE INVENTION

It is therefore an object of the invention to provide a blade server system. The blade server system has a middle plane board, connected to the advanced server management card (ASMC) via a USB signal line to simulate a remote USB optical disc drive or a remote USB floppy disc drive. When connected to a remote computer via the network, the server blade can even 'see' a virtual remote USB optical disc drive or remote USB floppy disc drive, and read or write data, or execute specific programs on the remote computer.

The invention achieves the above-identified object by locking a part of the pins of a connector on a server blade for USB specific application, so that other server blades having different pin definitions, as coupled to the middle plane board via the connector, cannot be correctly coupled to the USB signal lines on the middle plane board through these locked pins, thereby being not applicable to the blade server system of the invention.

It is therefore another object of the invention to provide a blade server system, including a middle plane board and a blade server. The server blade includes a first connector for electrically connecting the middle plane board. The first connector has several pins complying with an EPT 246-31300-15 specification. Among the pins, an H8 pin and an H9 pin are used for a USB special application. The middle plane board includes a second connector having several slots for receiving the pins correspondingly. A first slot and a second slot respectively receive the H8 pin and the H9 pin.

The first slot and the second slot are respectively connected to the ASMC via a first USB signal line and a second USB signal line. By locking the H8 pin and the H9 pin for the USB special application, the blade server system of the invention will not be copied by other manufacturers.

Other objects, features, and advantages of the invention will become apparent from the following detailed description of the preferred but non-limiting embodiments. The following description is made with reference to the accompanying drawings.

DETAILED DESCRIPTION OF THE INVENTION

Figure 1:
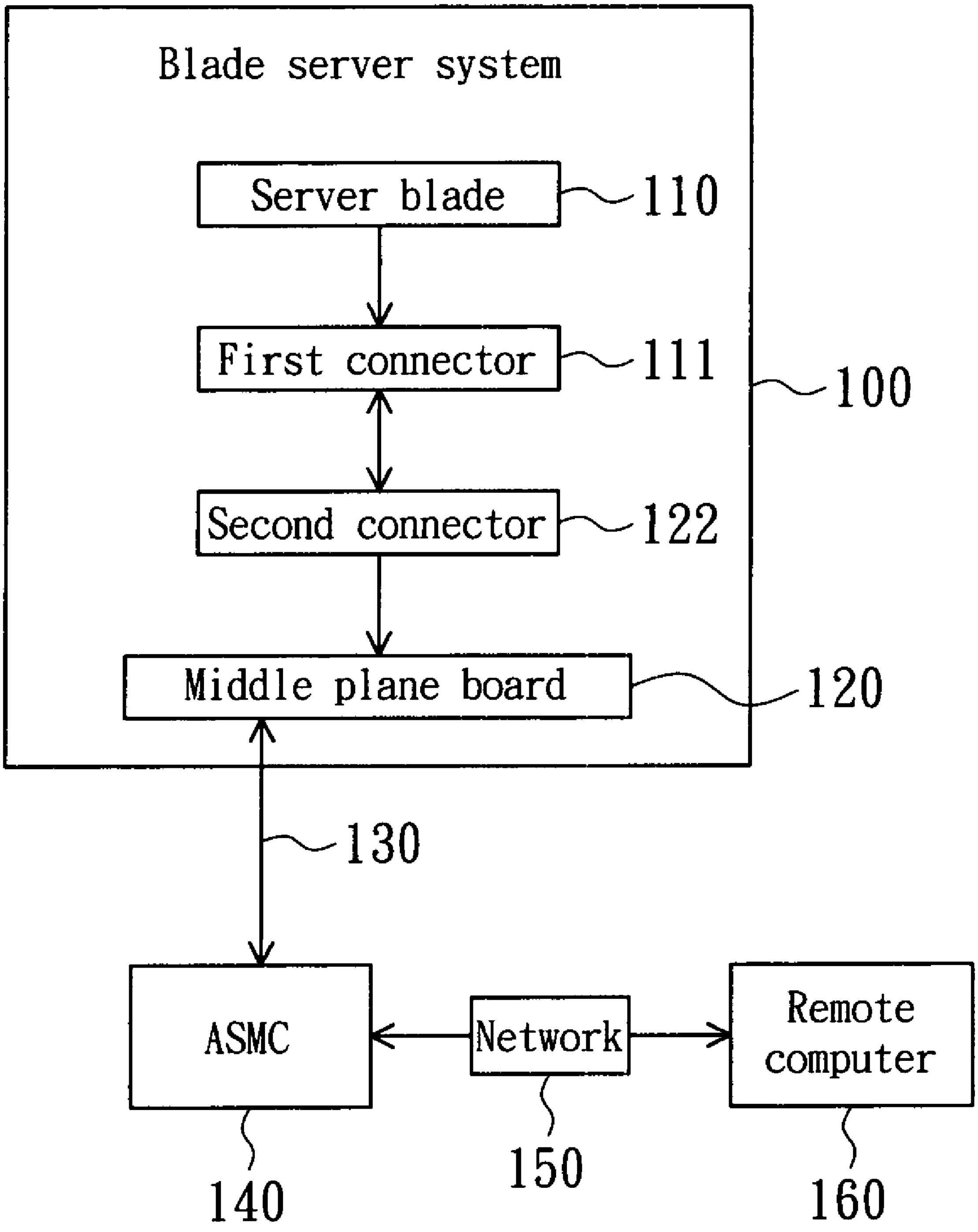
FIG. 1 is a USB application diagram of a blade server system according to a preferred embodiment of the invention.

Referring to FIG. 1, a USB application diagram of a blade server system according to a preferred embodiment of the invention is shown. The blade server system 100 includes a server blade 110 and a middle plane board 120. The server blade 110 includes a first connector 111 for electrically connecting a second connector 122 of the middle plane board 120. The middle plane board 120 is connected to an ASMC 140 via a USB signal line 130 to simulate a USB optical disc drive or a USB floppy disc drive. With the firmware design of the ASMC 140, the blade server system 100 recognizes the existence of the USB optical disc drive or the USB floppy disc drive. Alternatively, the ASMC 140 can be connected to a remote computer (console PC) 160 via a network 150. The remote computer 160 can have a dialogue with the ASMC via a user interface, so the server blade 110 can 'see' a virtual USB optical disc drive or USB floppy disc drive, and read or write data, or execute specific programs on the remote computer.

Figure 2A:
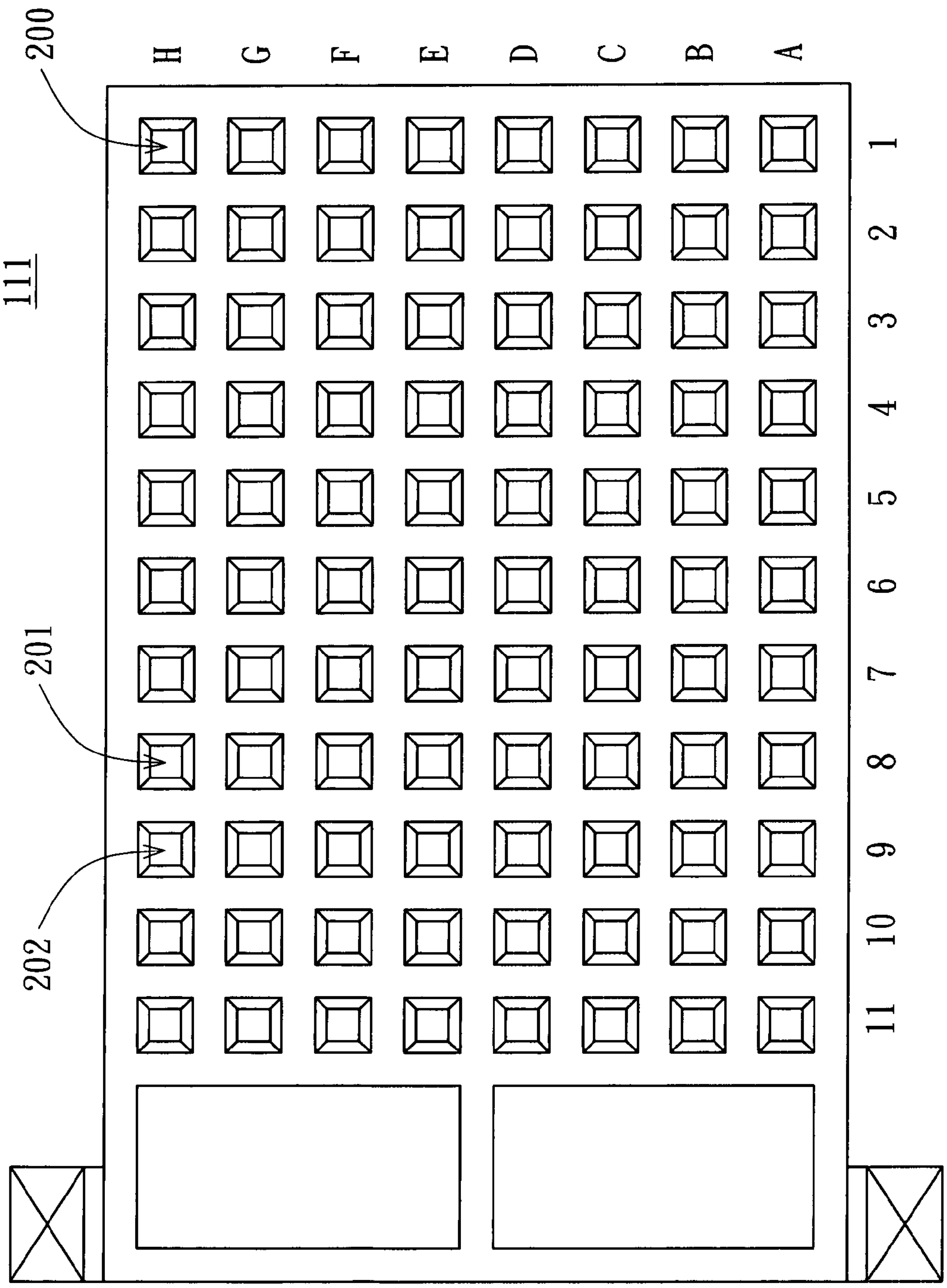
FIG. 2A is a detailed structure of the specification of a first connector in FIG. 1.
Figure 2B:
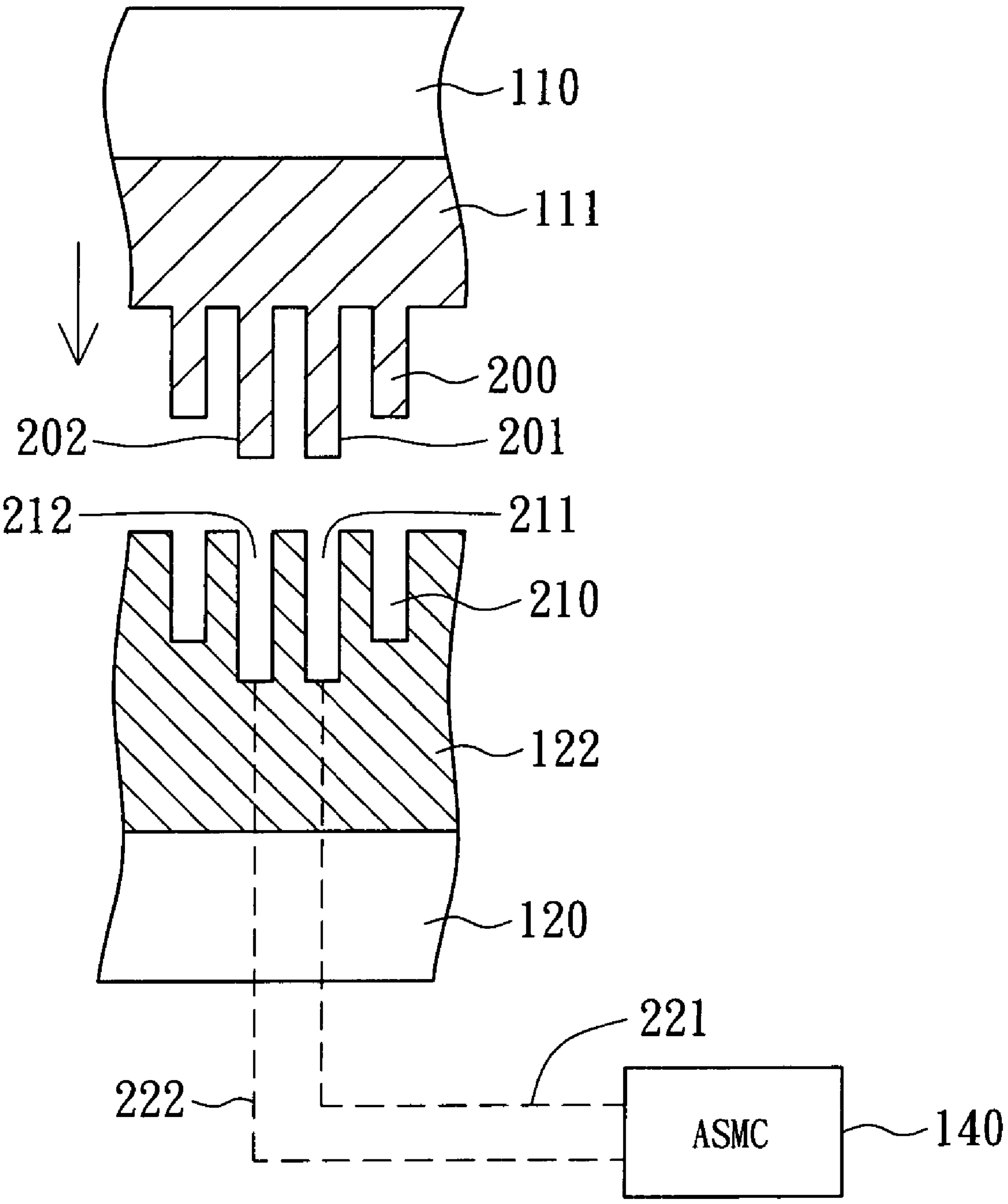
FIG. 2B is a cross-sectional structure diagram of FIG. 1 showing the H8 pin and the H9 pin of the first connector are connected to the USB signal lines of the second connector.

Referring to FIG. 2A, a detailed structure of the specification of the first connector 111 in FIG. 1 is shown. The first connector 111 has several pins 200 in accordance with an EPT 246-31300-15 specification. The pins 200, for example has 8 horizontal rows and 11 vertical columns, wherein the 8 horizontal rows are indexed by English capital letters A, B, C, D, E, F, G, H, while the 11 vertical columns are indexed by Arabic numbers, for example, H8 pin 201 and H9 pin 202. The invention designates and locks the H8 pin 201 and the H9 pin 202 for the above-mentioned special application of USB transmission. Besides, as shown in FIG. 2B, the second connector 122 includes several receptacles for receiving the pins, such as slots 210 for receiving the pins 200 correspondingly, where a first slot 211 and a second slot 212 in the slots 210 is for respectively receiving the H8 pin 201 and the H9 pin 202.

When the H8 pin 201 and the H9 pin 202 are respectively inserted into the first slot 211 and the second slot 212, the first slot 211 and the second slot 212 are connected to the ASMC 140 via the first USB signal line 221 and the second USB signal line 222 respectively. Therefore, the server management firmware of the ASMC 140 can decode and pack commands and data of the server blade 110 into a network packet, then have the packet transmitted to the remote computer 160 via the network 150. The remote computer 160 actually accesses optical disc drive data or changes to read specific data, startup programs or operating system programs for instance, packs the results and data into a network packet to be transmitted to the ASMC 140, then the data are converted into a USB packet via the ASMC and transmitted to the server blade 110, so that a USB special application required by the server blade 110 is completed.

According to the above-mentioned preferred embodiment, the blade server system of the invention has the following advantage. By locking two pins of a connector on a server blade for the above-mentioned USB special application, other server blades having different pin definitions, as coupled to the middle plane board via the connector, cannot be correctly coupled to the USB signal lines on the middle plane board through these locked pins, thereby being not applicable to the blade server system of the invention.

While the invention has been described by way of example and in terms of a preferred embodiment, it is to be understood that the invention is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A blade server system, comprising:

a middle plane board; and a server blade, comprising a first connector for electrically connecting to the middle plane board, wherein the first connector includes a plurality of pins complying with a specific connector specification, and only a specified pin which is located at a specified row and a specified column of the first connector and a another pin which is located at the specified row and a specified different column of the first connector are configured to receive a universal serial bus (USB) signal from the middle plane board;

wherein the pins are arrayed in eight (8) horizontal rows and eleven (11) vertical columns, and the eight (8) horizontal rows are indexed by English capital letters A, B, C, D, E, F, G, H, while the eleven (11) vertical columns are indexed by Arabic numbers;

wherein the specified pin is an H8 pin positioned at the Hth horizontal row and the eighth ($8^{th}$) vertical column, and the another pin is an H9 in positioned at the Hth horizontal row and the ninth ($9^{th}$) vertical column;

wherein the middle plane board comprises a second connector, the second connector comprises a plurality of slots for receiving the pins correspondingly, wherein a first slot and a second slot are for respectively receiving the H8 pin and the H9 pin;

wherein the first slot and the second slot are respectively connected to an advanced server management card (ASMC) via a first USB signal line and a second USB signal line.

2. The blade server system according to claim 1, wherein the specified row is an Hth horizontal row and the specified column is an eighth vertical column, and the specified different column is a ninth vertical column.

3. The blade server system according to claim 1, wherein the specific connector specification-specifies that the plurality of pins are arrayed in 8 horizontal rows, indexed by English capital letters A, B, C, D, E, F, G, H, and 11 vertical columns, indexed by Arabic numbers, or a derived product of the same series.

4. A blade server system, comprising:

a middle plane board;

a server blade, comprising a first connector for electrically connecting to the middle plane board, wherein the first connector of the server blade has a plurality of pins complying with a specific connector of the middle plane board, and only a first pin and a second pin of the first connector are configured to receive a plurality of USB signal slots of a specific connector of the middle plane board, correspondingly;

an advanced server management card (ASMC), electrically connecting to the first pin and the second pin; and a remote computer, linked to the ASMC via a network.

5. The blade server system according to claim 4, wherein the remote computer has an optical disc drive or a floppy disc drive.

* * * * *